United States Patent
Miyoshi

(10) Patent No.: US 8,917,525 B2
(45) Date of Patent: Dec. 23, 2014

(54) ELECTRONIC APPARATUS AND FIXING STRUCTURE

(71) Applicant: JVC KENWOOD Corporation, Yokohama-shi, Kanagawa (JP)

(72) Inventor: Sachiyo Miyoshi, Yokohama (JP)

(73) Assignee: JVC KENWOOD Corporation, Yokohama-shi, Kanagawa (JP)

( * ) Notice: Subject to any disclaimer, the term of this patent is extended or adjusted under 35 U.S.C. 154(b) by 147 days.

(21) Appl. No.: 13/835,947

(22) Filed: Mar. 15, 2013

(65) Prior Publication Data

US 2013/0258633 A1    Oct. 3, 2013

(30) Foreign Application Priority Data

Mar. 28, 2012 (JP) ................... 2012-073556
May 11, 2012 (JP) ................... 2012-109294

(51) Int. Cl.
  *H05K 9/00*    (2006.01)
  *H05K 5/06*    (2006.01)
  *F16B 35/00*   (2006.01)

(52) U.S. Cl.
  CPC ............. *H05K 5/061* (2013.01); *F16B 35/00* (2013.01)
  USPC ........................................ 361/816; 361/818

(58) Field of Classification Search
  USPC .......... 361/801–802, 816, 818; 411/302, 303, 411/324, 313, 314, 369, 370
  See application file for complete search history.

(56) References Cited

U.S. PATENT DOCUMENTS

| | | | |
|---|---|---|---|
| 4,529,346 A * | 7/1985 | Aubel et al. | 411/117 |
| 7,886,903 B1 * | 2/2011 | Wurzelbacher, Jr. et al. | 206/320 |
| 2007/0081804 A1 * | 4/2007 | Su | 396/29 |
| 2008/0227045 A1 * | 9/2008 | Deng | 431/354 |
| 2009/0057591 A1 * | 3/2009 | Izzy et al. | 251/288 |

FOREIGN PATENT DOCUMENTS

| | | |
|---|---|---|
| JP | 11-135189 | 5/1999 |
| JP | 2004-286376 | 10/2004 |
| JP | 2009-135356 | 6/2009 |
| JP | 4323237 | 9/2009 |

* cited by examiner

*Primary Examiner* — Hung S Bui
(74) *Attorney, Agent, or Firm* — Nath, Goldberg & Meyer; Jerald L. Meyer; Stanley N. Protigal

(57) ABSTRACT

An insertion member provided with a male thread on the peripheral surface thereof is inserted through an opening of a receiving member. The insertion member is fastened by a fastening member provided with a female thread on the inner surface thereof. A first O-ring is provided between the insertion member and the fastening member, and a second O-ring is provided between the fastening member and the receiving member. When viewing each circular cross-section of the first and second O-rings along a surface parallel to a moving direction of the fastening member at the point of fastening the insertion member by rotating the fastening member, a first point of each circular cross-section is pressed against a surface perpendicular to the moving direction, and a position displaced from a second point opposite to the first point of each circular cross-section is pressed against an inclined surface inclined to the moving direction.

12 Claims, 8 Drawing Sheets

ELECTRONIC APPARATUS AND FIXING STRUCTURE

CROSS REFERENCE TO RELATED APPLICATION

This application is based upon and claims the benefit of priority under 35 U.S.C. §119 from Japanese Patent Applications No. P2012-073556, filed on Mar. 28, 2012, and No. 2012-109294, filed on May 11, 2012, the entire contents of both of which are incorporated herein by reference.

BACKGROUND

The embodiments relate to an electronic device such as a radio device and a fixing structure, and particularly, relate to an electronic apparatus and a fixing structure having an improved waterproof and dustproof property that prevents water and dust from entering through a gap between an insertion member and an opening formed in a receiving member into which the insertion member is inserted.

Radio devices as an example of electronic apparatuses include a turn operation member for volume controlling or encoding. The turn operation member has a main body having a side longer than the diameter of an opening formed in a chassis, and a turn operation shaft integrated with the main body. When the turn operation shaft is inserted through the opening from the underside of the chassis, the main body is positioned on the underside of the chassis and the turn operation shaft projects from the chassis. The turn operation shaft is provided with a male screw thread on the peripheral surface thereof. The turn operation shaft is fastened by a nut provided with a female screw thread, so that the turn operation member is fixed to the chassis. For example, Japanese Patent No. 4323237 (Patent Document 1) describes a radio device having the above-mentioned structure.

However, water or dust may enter through a gap between the turn operation shaft and the opening if the turn operation shaft is merely fastened by the nut. Therefore, it is required to provide a waterproof and dustproof structure between the chassis and the turn operation shaft in order to prevent the entrance of water and dust into the radio device. For example, Japanese Patent Unexamined Publication No. H11-135189 (Patent Document 2) and Japanese Patent Unexamined Publication No. 2004-286376 (Patent Document 3) describe a waterproof and dustproof structure by use of O-rings, and devices having such a structure are in widespread use.

SUMMARY

In general, it is necessary to increase the number of components used in an electronic apparatus in order to achieve a higher waterproof and dustproof effect. On the contrary, it is preferable to prevent an increase of the number of components since it increases production costs and decreases the efficiency of producing the electronic apparatus. Thus, an electronic apparatus and a fixing structure preferably have a waterproof and dustproof property capable of effectively preventing the entrance of water and dust therein while the number of components used in the electronic apparatus and the fixing structure is minimized.

It is an object of the embodiments to provide an electronic apparatus and a fixing structure capable of effectively preventing the entrance of water and dust with a small number of components.

In order to solve the conventional problem, a first aspect of the embodiments provides an electronic apparatus comprising: a receiving member having an opening; an insertion member that is inserted through the opening and provided with a male thread on a peripheral surface thereof; a fastening member that is provided with a female thread on an inner surface thereof threadably engaged with the male thread, fixes the insertion member to the receiving member by engaging the female thread with the male thread, and covers the opening; and a first O-ring positioned between the insertion member and the fastening member and a second O-ring positioned between the fastening member and the receiving member, in a state in which the insertion member is fastened by the fastening member, wherein, when viewing each circular cross-section of the first and second O-rings along a surface parallel to a moving direction of the fastening member when fastening the insertion member by rotating the fastening member, a first point of each circular cross-section is pressed against a surface perpendicular to the moving direction, and a position displaced from a second point opposite to the first point of each circular cross-section is pressed against an inclined surface inclined to the moving direction.

A second aspect of the embodiments provides a fixing structure for fixing, to a receiving member having an opening, an insertion member inserted through the opening and provided with a male thread on a peripheral surface thereof, the fixing structure comprising: a fastening member that is provided with a female thread on an inner surface thereof threadably engaged with the male thread, fixes the insertion member to the receiving member by engaging the female thread with the male thread, and covers the opening; and a first O-ring positioned between the insertion member and the fastening member and a second O-ring positioned between the fastening member and the receiving member, in a state in which the insertion member is fastened by the fastening member, wherein, when viewing each circular cross-section of the first and second O-rings along a surface parallel to a moving direction of the fastening member when fastening the insertion member by rotating the fastening member, a first point of each circular cross-section is pressed against a surface perpendicular to the moving direction, and a position displaced from a second point opposite to the first point of each circular cross-section is pressed against an inclined surface inclined to the moving direction.

DETAILED DESCRIPTION

<First Embodiment>

Figure 6:
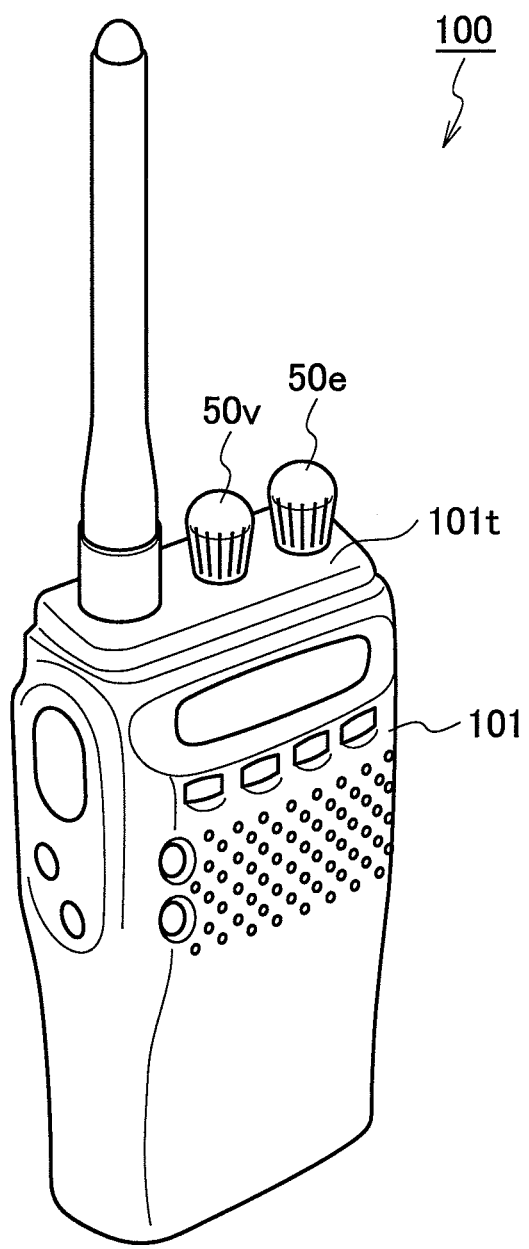
FIG. 6 is a perspective view showing a radio device which is the electronic apparatus according to the first and second embodiments.

An electronic apparatus and a fixing structure according to a first embodiment are explained below with reference to the accompanying drawings. A radio device 100 shown in FIG. 6 is an example of the electronic apparatus according to the first embodiment. The radio device 100 shown in FIG. 6 has two knobs 50v and 50e provided on the upper surface 101t of a case body 101 made of plastic resin.

For example, the knob 50v is a receiver volume control, and the knob 50e is an encode dial for selecting transmitted/received frequencies (channels). The knob 50v is attached to a device for volume control described below, and the knob 50e is attached to a device for transmitted/received frequency selection.

Note that at least one knob is required in the present embodiment; however, the number of knobs provided is not particularly limited. Hereinafter, the knobs 50v and 50e are collectively referred to as a knob 50.

The structure for fixing the device for volume control or for transmitted/received frequency selection to a chassis inside the case body 101 is explained below with reference to FIG. 1 to FIG. 4. This fixing structure has a waterproof and dust-proof property.

Figure 1:
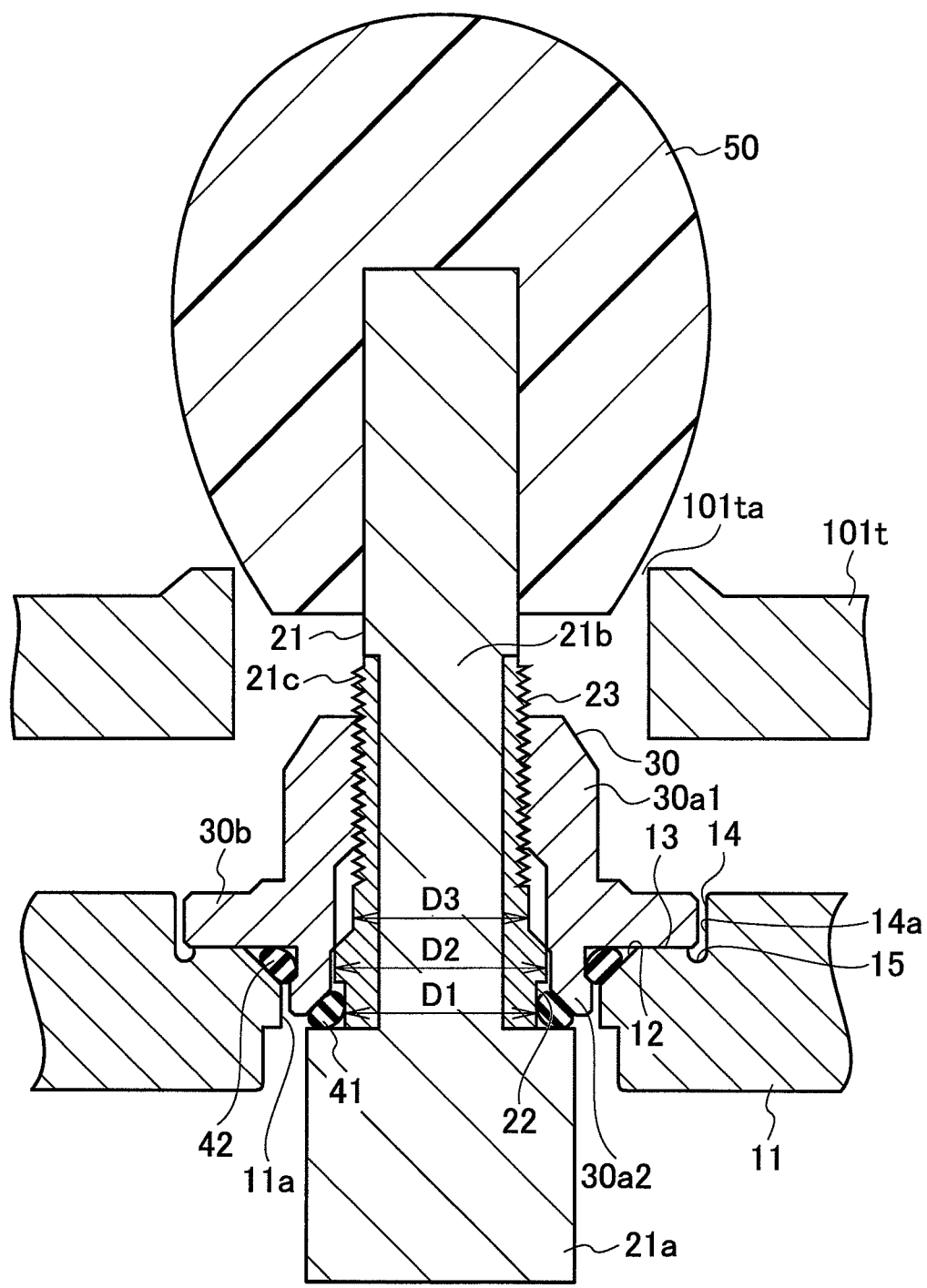
FIG. 1 is a partial cross-sectional view showing an electronic apparatus and a fixing structure according to a first embodiment.

In FIG. 1, a chassis 11 made of metal has a circular opening 11a. A device 21 for volume control or for transmitted/received frequency selection is inserted from the underside (the lower side in FIG. 1) of the chassis 11 through the opening 11a. The device 21 is an example of an insertion member, and the chassis 11 is an example of a receiving member in which the insertion member is inserted.

The chassis 11 is provided with an inclined surface 12 at a chamfered edge on the opening 11a side. The inclined surface 12 is inclined in such a manner as to be inversely tapered toward the upper surface (the upper side in FIG. 1) of the chassis 11 from the opening 11a. The chassis 11 is also provided with a flat surface 13 located adjacent to the inclined surface 12 and parallel to the upper surface of the chassis 11.

The chassis 11 is provided with a ring-like recess portion 14 recessed in the thickness direction of the chassis 11. The bottom of the recess portion 14 is the flat surface 13. The recess portion 14 serves as a holding section to hold a flange 30b of a nut 30 described below. The circumference of the recess portion 14 is a vertical surface 14a perpendicular to the upper surface of the chassis 11.

The corner of the flat surface 13 and the vertical surface 14a in the chassis 11 is provided with a groove 15 recessed downward from the flat surface 13. In the case of manufacturing plural chassis 11 by die-casting, for example, the groove 15 contributes to keeping a predetermined area of the flat surface 13. Thus, it is preferable to provide the groove 15 in the corner of the flat surface 13 and the vertical surface 14a.

The device 21 includes a main body 21a that stores a circuit for volume control or for transmitted/received frequency selection, a rotatable turn operation shaft 21b projecting from the main body 21a and inserted through the opening 11a, and a male thread formation member 21c provided on the peripheral surface of the turn operation shaft 21b and fixed to the main body 21a.

A male thread is provided on the peripheral surface of the male thread formation member 21c. The male thread is located on the upper side of the male thread formation member 21c within a predetermined area away from the main body 21a. The area where the male thread is formed is defined as a male thread part 23. The turn operation shaft 21b and the male thread formation member 21c are made of metal.

An O-ring 41 made of an elastic body such as rubber is placed in the corner of the main body 21a and the male thread formation member 21c. The base portion of the male thread formation member 21c on the main body 21a side has a diameter D1. The portion adjacent to the base portion with the diameter D1 on the opposite side to the main body 21a has a diameter D2 larger than the diameter D1. The portion adjacent to the portion with the diameter D2 toward the tip of the male thread formation member 21c has a diameter D3 smaller than the diameter D2. The boundary between the portion with the diameter D2 and the portion with the diameter D3 has a diameter that gradually decreases from the diameter D2 to the diameter D3.

The male thread formation member 21c is provided with the portion with the diameter D2 so that the base portion on the main body 21a side is concave in the diametrical direction of the turn operation shaft 21b. The concave portion serves as a holding section 22 to hold the O-ring 41. Although the concave portion does not completely cover the cross-section of the O-ring 41 in the figures, the concave portion is referred to as the holding section 22 in this embodiment. The holding section 22 prevents the O-ring 41 from moving toward the tip of the male thread formation member 21c. The provision of the holding section 22 is not necessary, but preferable.

A circular opening 101ta is provided on the upper surface 101t of the case body 101. The turn operation shaft 21b projects upward from the opening 101ta. The device 21 is fixed to the chassis 11 by the nut 30 made of metal. The knob 50 is attached to the tip of the turn operation shaft 21b. The nut 30 is an example of a fastening member.

The nut 30 includes an upper cylindrical part 30a1, a lower cylindrical part 30a2, and a flange 30b located between the upper cylindrical part 30a1 and the lower cylindrical part 30a2 and projecting therefrom. The flange 30b has a flat surface on the chassis 11 side (the underside). A female thread is provided on the inner surface of the upper cylindrical part 30a1. An O-ring 42 made of an elastic body such as rubber is placed in the corner of the underside of the flange 30b and the peripheral surface of the lower cylindrical part 30a2.

Figure 2:
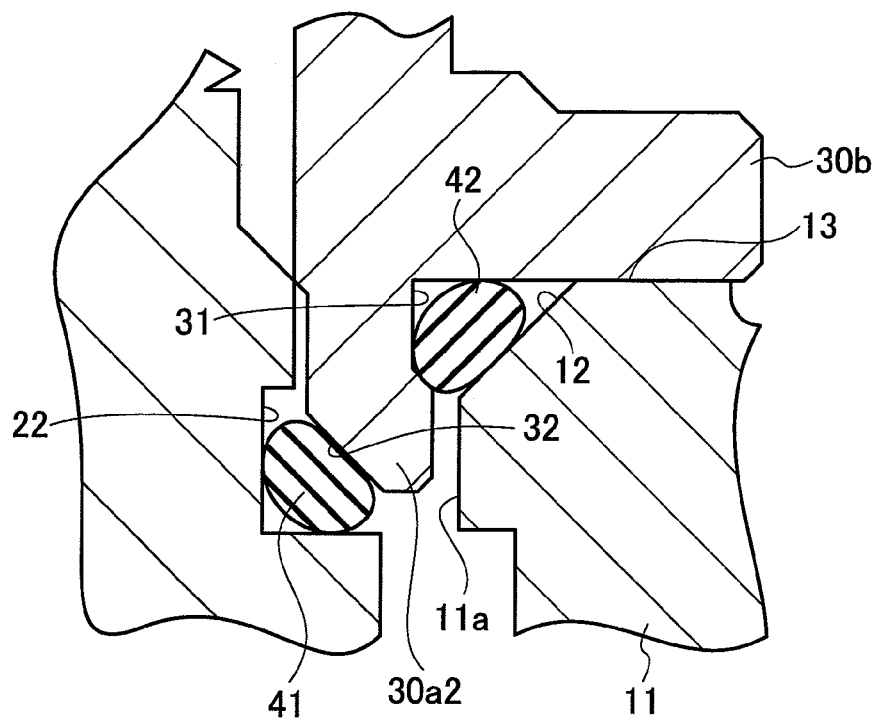
FIG. 2 is an enlarged partial cross-sectional view of FIG. 1.

As shown in the enlarged view of FIG. 2, the corner of the flange 30b and the lower cylindrical part 30a2 is concave in the diametrical direction of the nut 30. This concave portion serves as a holding section 31 to hold the O-ring 42. The holding section 31 prevents the O-ring 42 from being removed from the lower cylindrical part 30a2. The provision of the holding section 31 is not necessary, but preferable.

The lower cylindrical part 30a2 is provided with an inclined surface 32 at a chamfered edge on the inner side adjacent to the bottom of the lower cylindrical part 30a2. The inclined surface 32 is inclined in such a manner as to be tapered from the bottom of the lower cylindrical part 30a2 toward the flange 30b (the upper side of the nut 30) to come closer to the device 21.

Figure 3:
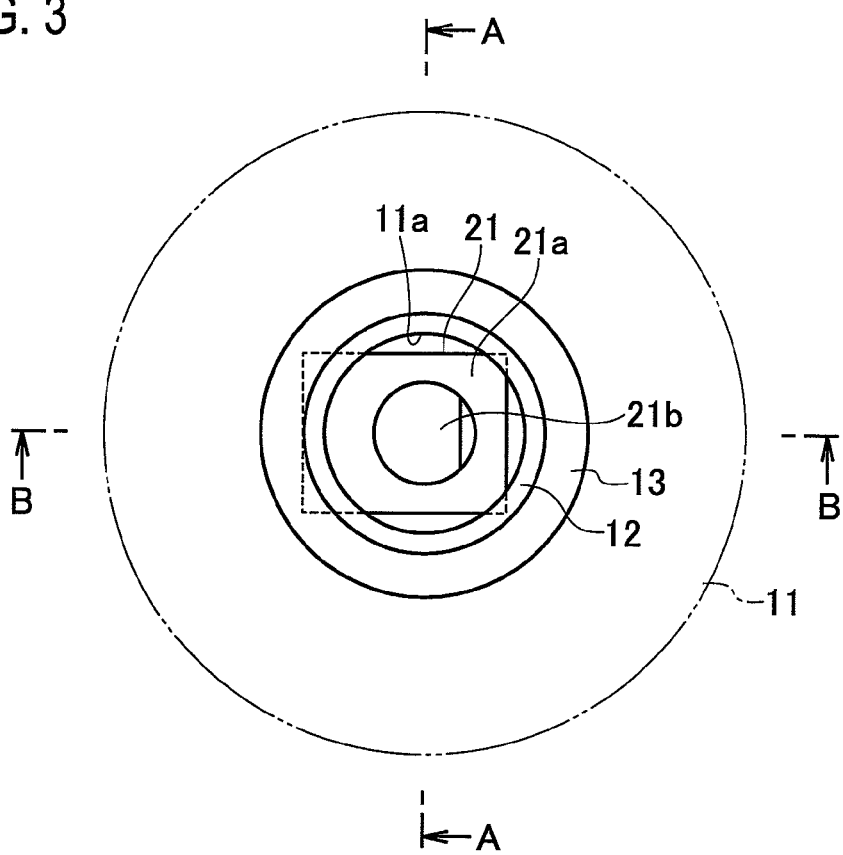
FIG. 3 is a plan view showing the electronic apparatus and the fixing structure according to the first embodiment, from which some components are removed.

FIG. 3 is a plan view showing the chassis 11 from the tip side of the turn operation shaft 21b in the state in which the nut 30 and the knob 50 are removed from the electronic apparatus shown in FIG. 1. FIG. 1 is a cross-sectional view along the line A-A in FIG. 3, and shows the state in which the nut 30, the knob 50 and the case body 101 (the upper surface 101t) are added in the A-A cross-sectional view.

As shown in FIG. 3, the main body 21a has a rectangular shape in a planar view, and has a side longer than the diameter of the opening 11a. Therefore, the upward movement of the device 21 in FIG. 1 is regulated due to part of the main body 21a being located outside the opening 11a of the chassis 11.

The nut 30 is mounted on the male thread formation member 21c in the state in which the knob 50 and the case body 101 are not present as shown in FIG. 3. Then, the nut 30 rotates around the male thread formation member 21c so that the female thread formed on the inner surface of the upper cylindrical part 30a1 is threadably engaged with the male thread part 23 of the male thread formation member 21c. Accordingly, the device 21 is fixed to the chassis 11 and fastened by the nut 30.

As described above, the chassis 11 is provided with the recess portion 14 recessed in the thickness direction of the chassis 11 (that is, in the moving direction of the nut 30). Once the male thread formation member 21c is fastened by the nut 30, the flange 30b is held in the recess portion 14 as shown in FIG. 1. A gap is provided between the vertical surface 14a and the peripheral surface of the flange 30b. The thickness of the flange 30b is preferably substantially the same as the depth of the recess portion 14 so that the upper surface of the flange 30b is on the same level as the upper surface of the chassis 11.

Functions of the O-rings 41 and 42 and the inclined surfaces 12 and 32 in the process of fixing the device 21 to the chassis 11 by the nut 30 will be explained in detail below.

Figure 4:
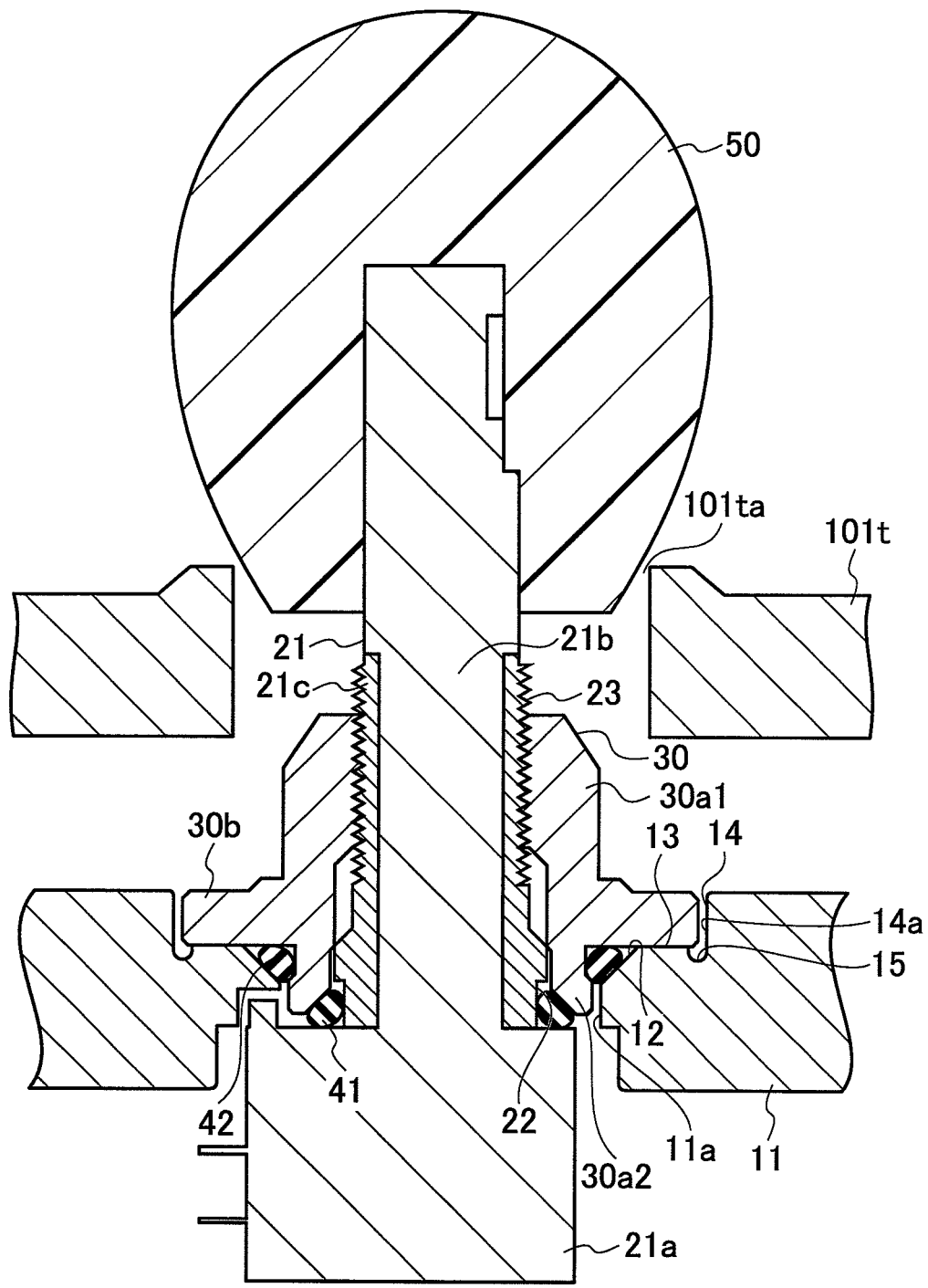
FIG. 4 is a partial cross-sectional view of a different section from FIG. 1 showing the electronic apparatus and the fixing structure according to the first embodiment.

FIG. 4 is a cross-sectional view along the line B-B in FIG. 3, and shows the state in which the nut 30, the knob 50 and the case body 101 (the upper surface 101t) are added in the B-B cross-sectional view. As shown in FIG. 3 and FIG. 4, a cutout is provided in the circular cross-section at the tip of the turn operation shaft 21b. The knob 50 is provided with a hollow in which the turn operation shaft 21b is inserted. The hollow has a shape corresponding to the cutout of the turn operation shaft 21b. Therefore, the knob 50 does not rotate around the turn operation shaft 21b independently, but rotates together with the turn operation shaft 21b.

Figure 5A:
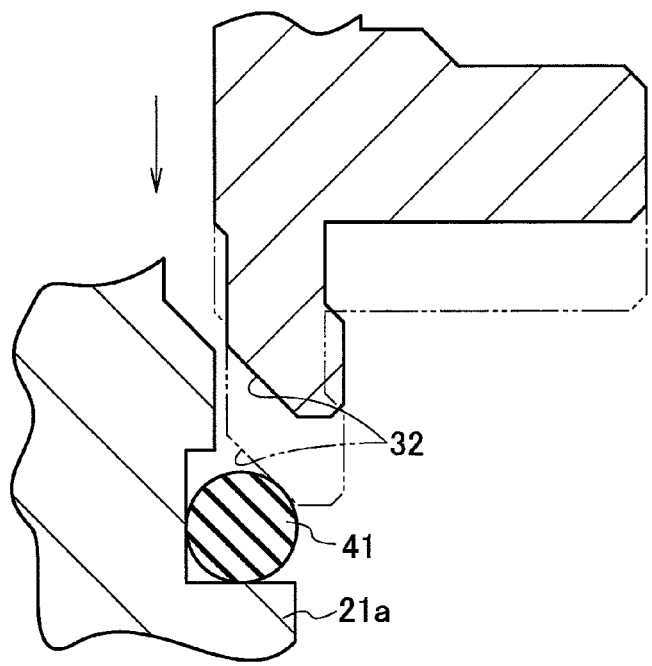
FIG. 5A is an enlarged partial cross-sectional view of an O-ring 41 and an inclined surface 32 for explaining functions of the electronic apparatus and the fixing structure according to the first embodiment.
Figure 5B:
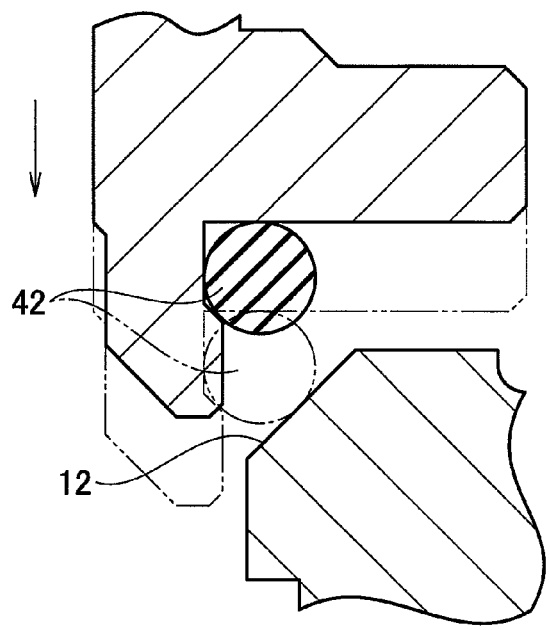
FIG. 5B is an enlarged partial cross-sectional view of an O-ring 42 and an inclined surface 12 for explaining functions of the electronic apparatus and the fixing structure according to the first embodiment.

The functions of the O-rings 41 and 42 and the inclined surfaces 12 and 32 in the process of fixing the device 21 to the chassis 11 by the nut 30 are explained with reference to FIG. 5A and FIG. 5B. FIG. 5A and FIG. 5B are enlarged partial cross-sectional views of the O-rings 41 and 42 and the inclined surfaces 12 and 32 shown on the right in FIG. 1.

As shown in FIG. 5A, as the nut 30 rotates around the male thread formation member 21c and moves downward, the inclined surface 32 inclined to the moving direction of the nut 30 indicated by the arrow comes closer to the O-ring 41.

The inclined surface 32 then comes into contact with and presses the O-ring 41 at a position displaced from the top of the circular cross-section of the O-ring 41 in FIG. 5A. Note that the circular cross-section of the O-ring 41 is a cross-section parallel to the moving direction of the nut 30. The bottom of the circular cross-section of the O-ring 41 is in contact with the surface perpendicular to the moving direction of the nut 30. Thus, the surface 32 continuously presses the O-ring 41 at the position displaced from the top of the circular cross-section of the O-ring 41 in association with the downward rotation of the nut 30.

As shown in FIG. 5B, as the nut 30 rotates around the turn operation shaft 21b and moves downward, the circular cross-section of the O-ring 42 comes closer to the inclined surface 12 inclined to the moving direction of the nut 30 indicated by the arrow.

The O-ring 42 then comes into contact with and presses the inclined surface 12 at a position displaced from the bottom of the circular cross-section of the O-ring 42 in FIG. 5B. The top of the circular cross-section of the O-ring 42 is in contact with the lower surface of the flange 30b perpendicular to the moving direction of the nut 30. Thus, the O-ring 42 continuously presses the inclined surface 12 at the position displaced from the bottom of the circular cross-section of the O-ring 42 in association with the downward rotation of the nut 30.

According to the first embodiment as described above, the bottom/the top (a first point) of the circular cross-section of the O-ring 41/the O-ring 42 is pressed against the surface perpendicular to the moving direction of the nut 30. At the same time, the position displaced from the top/the bottom (a second point) of the circular cross-section of the O-ring 41/the O-ring 42 is pressed against the inclined surface 32/the inclined surface 12, so that the O-ring 41/the O-ring 42 is gradually deformed in association with the downward rotation of the nut 30.

Therefore, distortion in a plane perpendicular to the moving direction of the nut 30 between the top and the bottom of the circular cross-section is not easily caused even if the O-ring 41/the O-ring 42 is deformed. Accordingly, quite a high waterproof and dustproof effect can be achieved due to the configuration of the first embodiment.

However, if it is assumed that the O-ring 41/the O-ring 42 is held and pressed simultaneously by two surfaces on both upper and lower sides perpendicular to the moving direction of the nut 30 in association with the downward rotation of the nut 30, then in such a case, distortion in a plane perpendicular to the moving direction of the nut 30 between the top and the bottom of the circular cross-section would significantly be caused. As a result, a high waterproof and dustproof effect cannot be expected.

The first embodiment thus focuses on the shape of the nut 30 so as to achieve a waterproof and dustproof structure capable of effectively preventing the entrance of water and dust only by providing the O-rings 41 and 42. As is clear from the comparison with the structure described in Patent Document 1 that does not have a waterproof and dustproof property, the present embodiment adds only the O-rings 41 and 42 as the components to achieve the waterproof and dustproof structure and therefore can minimize components used in the electronic apparatus. The inventor has verified that the waterproof and dustproof structure according to the first embodiment can exert quite a high waterproof and dustproof effect.

It is possible to fix the device 21 to the chassis 11 only by preliminarily attaching the O-ring 41 and the O-ring 42 to the device 21 and the nut 30, respectively, and fastening the male thread part 23 of the device 21 by the nut 30. At the same time, it is possible to achieve a waterproof and dustproof structure by filling the opening 11a with the nut 30 and due to the effects of the O-rings 41 and 42.

Therefore, according to the first embodiment, it is possible to significantly improve the efficiency of producing the radio device 100 (the electronic apparatus).

In the first embodiment, the flat surface on the underside of the flange 30b in the nut 30 is in direct contact with the flat surface 13 formed in the chassis 11 on the outer side of the flange 30b away from the O-rings 41 and 42. As described above, the chassis 11 and the nut 30 are made of metal, and these metals are in close contact with each other without interposing any non-metallic material such as plastic therebetween. Thus, the device 21 can be tightly fixed to the chassis 11.

If a non-metallic material such as plastic is provided between the chassis 11 and the nut 30, the nut 30 tends to be loosened because of time degradation of the non-metallic material. As a result, the waterproof and dustproof effect is decreased. In addition, such a non-metallic material is easily damaged. In view of this, the structure in the first embodiment in which the metal flat surfaces are in direct contact with each other contributes to not only improving the strength of the fixing structure but also maintaining the long-term waterproof and dustproof effect.

Even if a relatively high impact is applied to the knob 50 in the radio device 100, damage caused by the applied impact can be minimized due to the strength of the fixing structure, which is an additional effect according to the first embodiment.

In the first embodiment, the O-ring 41 is attached to the device 21, and the O-ring 42 is attached to the nut 30. Alternatively, both O-rings 41 and 42 may be attached to the nut 30. Further, the O-ring 42 may be attached to the chassis 11 while the O-ring 41 is attached to the device 21.

The fundamental configuration of the electronic apparatus and the fixing structure according to the first embodiment includes at least the O-ring 41 (first O-ring) positioned between the device 21 and the nut 30 and the O-ring 42 (second O-ring) positioned between the nut 30 and chassis 11 in the state in which the device 21 (the insertion member) is fastened by the nut 30 (the fastening member).

In addition, in the electronic apparatus and the fixing structure according to the first embodiment, it is preferable to have a configuration in which, when viewing the circular cross-section of the respective O-rings 41 and 42 parallel to the moving direction of the nut 30 at the point of fastening the device 21 by rotating the nut 30, the first point is pressed against the surface perpendicular to the moving direction of the nut 30, and the position displaced from the second point opposite to the first point is pressed against the inclined surface inclined to the moving direction of the nut 30.

This configuration in the first embodiment causes little distortion of the O-rings 41 and 42 and thereby exerts quite a high waterproof and dustproof effect.

As shown in FIG. 1 and FIG. 4, the configuration in which the O-ring 41 is attached to the device 21 and the O-ring 42 is attached to the nut 30, is preferable since this fundamental configuration can be easily achieved. In this case, it is only required that the nut 30 is provided with the inclined surface 32 (the first inclined surface) that comes into contact with the position displaced from the second point in the O-ring 41, and the chassis 11 is provided with the inclined surface 12 (the second inclined surface) that comes into contact with the position displaced from the second point in the O-ring 42.

In order to position the O-rings 41 and 42 properly, the O-ring 41 is placed in the corner of the main body 21a and the turn operation shaft 21b of the device 21, and the O-ring 42 is placed in the corner of the surface of the flange 30b on the chassis 11 side and the peripheral surface of the lower cylindrical part 30a2. In addition, the holding section 22 (the first holding portion) to hold the O-ring 41 and the holding portion 31 (the second holding portion) to hold the O-ring 42 are provided so that the O-rings 41 and 42 are not easily removed.

The chassis 11 and the nut 30 are preferably made of metal. It is possible to increase the strength of the fixing structure by bringing the flat surface 13 (the first flat surface) formed in the chassis 11 into direct contact with the second flat surface on the underside of the flange 30b. Accordingly, it is possible to keep the waterproof and dustproof effect for a long period of time.

The chassis 11 is provided with the recess portion 14 to hold the flange 30b so that the upper surface of the flange 30b is on the same level as the upper surface of the chassis 11.

The above-described configuration of the first embodiment is particularly effective for electronic apparatuses such as the radio device 100 in which the knob 50 projects outward from the case body 101. Since the radio device 100 is intended for not only indoor use but also outdoor use, the radio device 100 may be externally damaged. If the radio device 100 does not have a waterproof and dustproof structure, water and dust can enter easily through the knob 50.

It is preferable to use the configuration according to the first embodiment in the radio device 100 since it exerts quite a high waterproof and dustproof effect. The knob 50 projects outward from the case body 101, and tends to be easily damaged by external factors. However, the strong fixing structure according to the first embodiment can prevent external damage on the knob 50. The fixing structure according to the first embodiment is thus applicable to the radio device 100.

<Second Embodiment>

Figure 7:
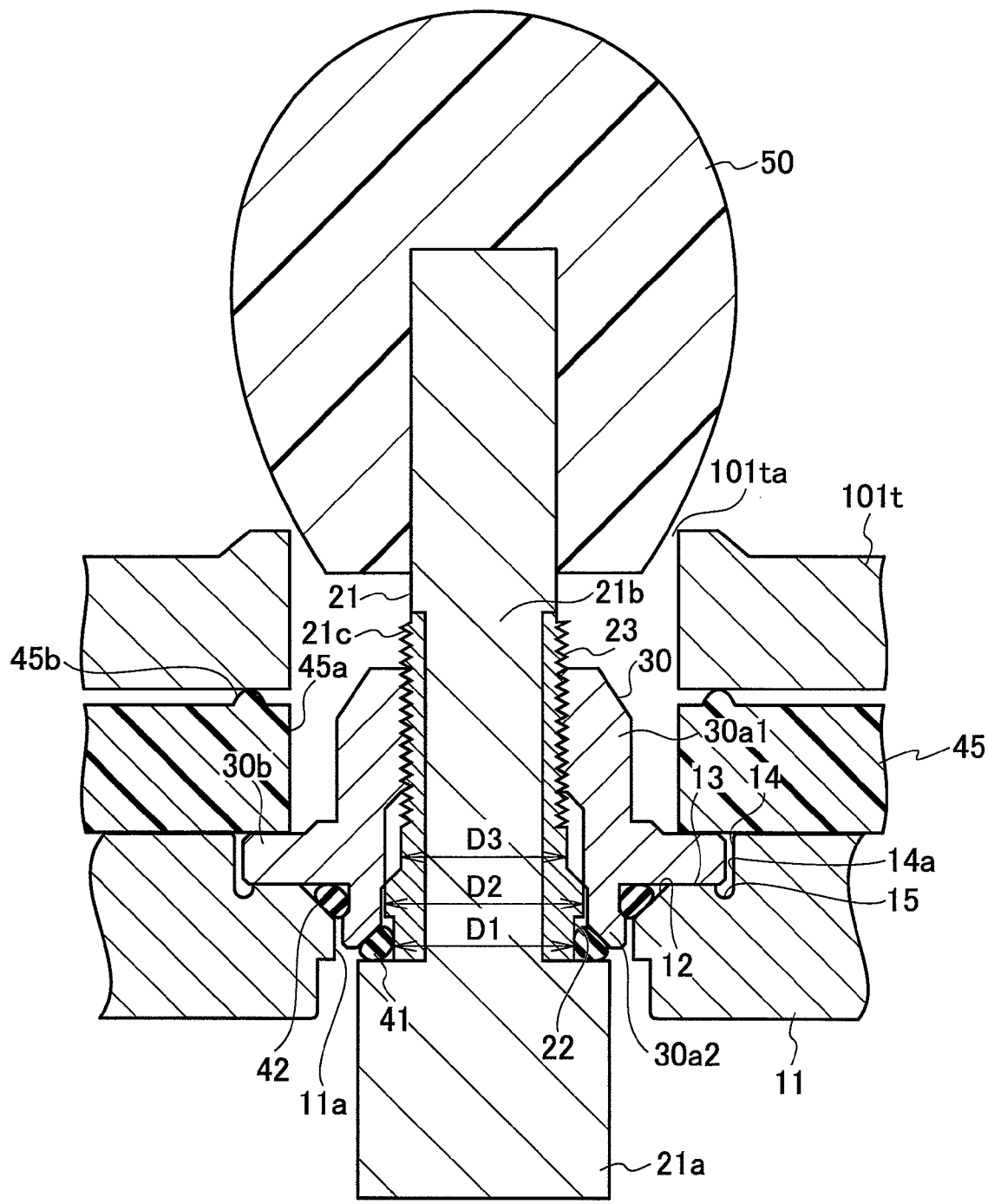
FIG. 7 is a partial cross-sectional view showing an electronic apparatus and a fixing structure according to the second embodiment.
Figure 8:
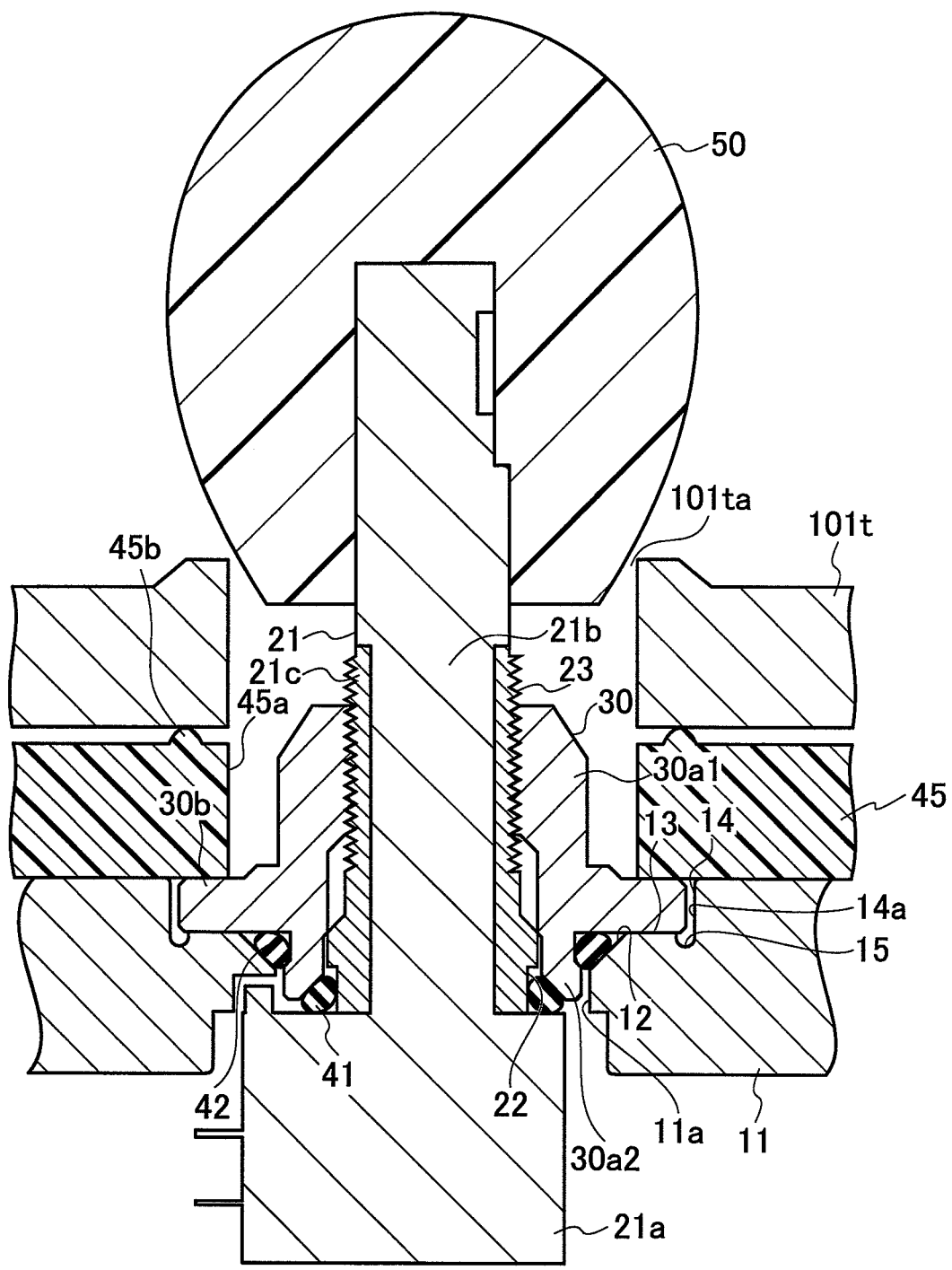
FIG. 8 is a partial cross-sectional view of a different section from FIG. 7 showing the electronic apparatus and the fixing structure according to the second embodiment.

An electronic apparatus and a fixing structure according to a second embodiment are explained below with reference to FIG. 7 to FIG. 10. The radio device 100 shown in FIG. 6 is also used as an example of the electronic apparatus according to the second embodiment. In FIG. 7 and FIG. 8, the same components as in FIG. 1 and FIG. 4 are indicated by the same reference numerals, and the explanations thereof are not repeated in this embodiment. FIG. 7 is a cross-sectional view along the line A-A in FIG. 3 as in the case of FIG. 1. FIG. 8 is a cross-sectional view along the line B-B in FIG. 3 as in the case of FIG. 4.

As shown in FIG. 7 and FIG. 8, a packing member 45 is provided between the upper surface 101t of the case body 101, and the chassis 11 and the flange 30b. The packing member 45 is placed over the chassis 11 as a receiving member and the flange 30b of the nut 30 as a fastening member.

The packing member 45 covers the entire upper surface of the chassis 11 facing the underside of the upper surface 101t of the case body 101 in the radio device 100 shown in FIG. 6. The packing member 45 is provided with an opening 45a through which the device 21 and the upper cylindrical part 30a1 of the nut 30 are inserted. Note that the radio device 100 has two knobs 50, and the packing member 45 is thus provided with two openings 45a.

The bottom of the packing member 45 is a flat surface that is in close contact with the upper surfaces of the chassis 11 and the flange 30b. The upper surface of the packing member 45 adjacent to the opening 45a is provided with a ring-like protrusion 45b projecting toward the upper surface 101t of the case body 101. It is preferable to provide the protrusion 45b on the upper surface of the packing member 45 in a position opposed to the flange 30b.

The packing member 45 shown in FIG. 7 and FIG. 8 is a first configuration example, and is provided with the protrusion 45b only on the upper surface thereof.

Figure 9:
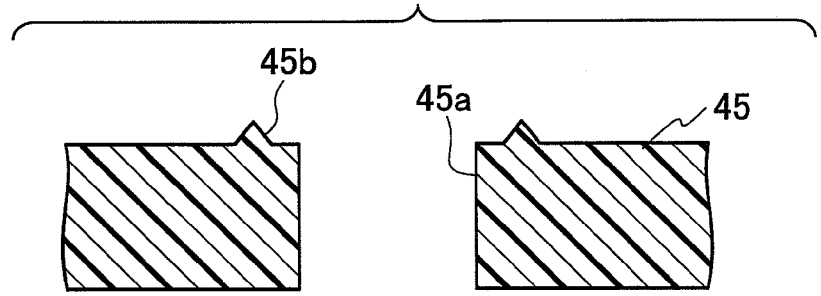
FIG. 9 is a partial sectional view showing a first configuration example of a packing member 45 shown in FIG. 7 and FIG. 8.

FIG. 9 only shows the packing member 45 of the first configuration example. The protrusion 45b in the first configuration example is substantially triangular in cross-section. The packing member 45 is held and pressed by the upper surface 101t of the case body 101, and the chassis 11 and the flange 30b. Therefore, the protrusion 45b substantially triangular in cross-section is crushed as shown in FIG. 7 and FIG. 8.

In the example shown in FIG. 7 and FIG. 8, the packing member 45 is held and pressed by the upper surface 101t of the case body 101, and the chassis 11 and flange 30b, as described above. The member by which the packing member 45 is held together with the chassis 11 and the flange 30b is not limited to the case body 101. The packing member 45 may be interposed between the chassis 11 and the flange 30b, and the other member (an arbitrary member) opposed to the chassis 11 and the flange 30b.

According to the second embodiment, the waterproof and dustproof effect can be further improved by the packing member 45. In the second embodiment, the flat surface on the underside of the flange 30b of the nut 30 is in direct contact with the flat surface 13 formed in the chassis 11, and the upper flat surface of the flange 30b is in direct contact with the packing member 45. These direct contacts cause friction and therefore the nut 30 is not easily loosened in the second embodiment.

Figure 10:
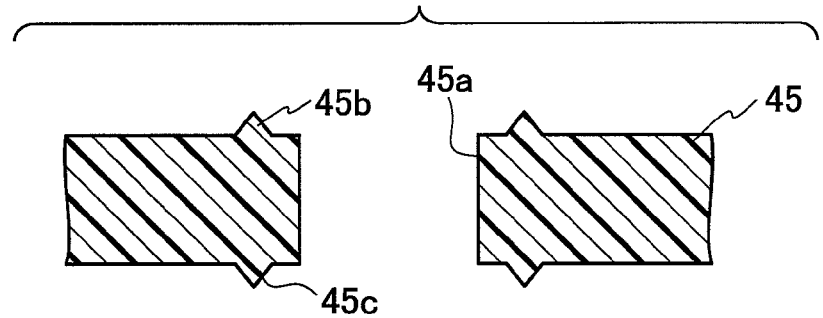
FIG. 10 is a partial sectional view showing a second configuration example of the packing member 45 shown in FIG. 7 and FIG. 8.

FIG. 10 shows a second configuration example of the packing member 45. The packing member 45 in the second configuration example is provided with a ring-like protrusion 45b on the upper surface adjacent to the opening 45a, and provided with a ring-like protrusion 45c on the lower surface adjacent to the opening 45a. The protrusion 45b and the protrusion 45c are provided in opposed positions.

Figure 11:
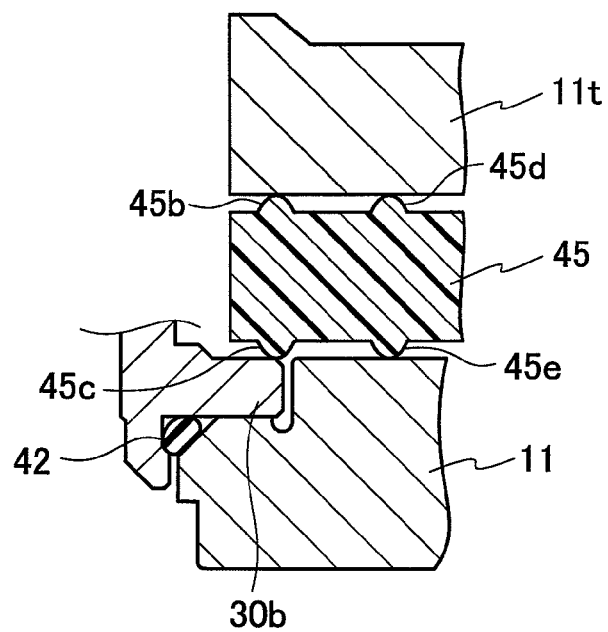
FIG. 11 is a partial sectional view showing a third configuration example of the packing member 45 shown in FIG. 7 and FIG. 8.

FIG. 11 shows a third configuration example of the packing member 45. FIG. 11 is an enlarged partial view of the right part of FIG. 7 and FIG. 8. The packing member 45 in the third configuration example is provided with a protrusion 45d on the upper surface and a protrusion 45e on the lower surface in positions away from the opening 45a, in addition to the protrusions 45b and 45c provided in the same manner as the second configuration example. The protrusion 45d and the protrusion 45e are provided in opposed positions. The protrusions 45b and 45c are located in positions opposed to the flange 30b, and the protrusions 45d and 45e are located in positions opposed to the chassis 11.

Although the protrusions 45b to 45e in the first to third configuration examples of the packing member 45 are substantially triangular in cross-section, the shape of these protrusions is not particularly limited. For example, the tips of the protrusions 45b to 45e may be curved in cross-section to have an arc-like shape.

Alternatively, the packing member 45 may be deformed to serve as a torque control member that controls torque when rotating the knob 50, as described in Japanese Patent Unexamined Publication No. 2009-135356.

In particular, the packing member 45 is provided across the chassis 11 and the flange 30b of the nut 30 as a fastening member, and held by the chassis 11 and the upper surface 101t of the case body 101. The packing member 45 is then pressed against the inner wall of the knob 50 or the turn operation shaft 21b so as to be deformed. In this case, the packing member 45 does not necessarily have a waterproof and dustproof effect.

As described above, the electronic apparatus and the fixing structure according to the first and second embodiments can prevent the entrance of water and dust effectively while minimizing the number of components.

The present invention is not limited to the first and second embodiments described above, and various modifications and improvements may be made within the scope of the present invention. The fixing structure for fixing the insertion member to the receiving member has been explained as the waterproof and dustproof structure in the first and second embodiments. However, it is apparent that the fixing structure according to the first and second embodiments can prevent the entrance of other liquids such as oil instead of water.

The fixing structure according to the first and second embodiment is applicable to other electronic apparatuses such as acoustic consoles other than the radio device 100, and also applicable to purposes other than electronic apparatuses. For example, the fixing structure according to the first and second embodiments may be used for piping of in-vehicle radio devices or shaft fixtures such as oil pipes.

The fixing structure may be provided with any other waterproof and dustproof members in order to improve the waterproof and dustproof effect. It is obvious that the present invention is not limited to the configuration in which the waterproof and dustproof structure is achieved only by two O-rings, or only by two O-rings and a packing member.

What is claimed is:

1. An electronic apparatus comprising:
a receiving member having an opening;
an insertion member that is inserted through the opening and provided with a male thread on a peripheral surface thereof;
a fastening member that is provided with a female thread on an inner surface thereof threadably engaged with the male thread, fixes the insertion member to the receiving member by engaging the female thread with the male thread, and covers the opening; and
a first O-ring positioned between the insertion member and the fastening member and a second O-ring positioned between the fastening member and the receiving member, in a state in which the insertion member is fastened by the fastening member,
wherein, when viewing each circular cross-section of the first and second O-rings along a surface parallel to a moving direction of the fastening member when fastening the insertion member by rotating the fastening member, a first point of each circular cross-section is pressed against a surface perpendicular to the moving direction, and
a position displaced from a second point opposite to the first point of each circular cross-section is pressed against an inclined surface inclined to the moving direction.

2. The electronic apparatus according to claim 1, wherein:
the first O-ring is attached to the insertion member and the second O-ring is attached to the fastening member,
the fastening member is provided with a first inclined surface that comes into contact with the position displaced from the second point of the first O-ring, and
the receiving member is provided with a second inclined surface that comes into contact with the position displaced from the second point of the second O-ring.

3. The electronic apparatus according to claim 2, wherein:
the insertion member includes a main body having a side longer than a diameter of the opening, a rotatable turn operation shaft projecting from the main body and inserted through the opening, and a male thread formation member provided with the male thread on a peripheral surface thereof, provided on a peripheral surface of the turn operation shaft and fixed to the main body,
the fastening member includes a cylindrical part and a flange projecting from the cylindrical part,
the first O-ring is placed in a corner of the main body and the male thread formation member,
the first inclined surface is provided on an inner surface adjacent to a bottom of the cylindrical part facing the main body, the second O-ring is placed in a corner of a surface of the flange facing the receiving member and a peripheral surface of the cylindrical part, and the second inclined surface is provided at an edge of the opening of the receiving member.

4. The electronic apparatus according to claim 2, wherein the insertion member is provided with a first holding section that is recessed in a diametrical direction of the insertion member to hold the first O-ring.

5. The electronic apparatus according to claim 2, wherein the fastening member is provided with a second holding section that is recessed in a diametrical direction of the fastening member to hold the second O-ring.

6. The electronic apparatus according to claim 3, wherein:
the receiving member and the fastening member are made of metal,
the receiving member is provided with a first flat surface parallel to a direction perpendicular to the moving direction,
the surface of the flange facing the receiving member is a second flat surface opposed to the first flat surface, and
the first flat surface comes into contact with the second flat surface on an outer side of the flange away from the second O-ring.

7. The electronic apparatus according to claim 3, wherein the receiving member is provided with a recess portion recessed in the moving direction to hold the flange.

8. The electronic apparatus according to claim 3, wherein:
the main body stores a circuit that adjusts the electronic apparatus to a predetermined setting condition, and
the turn operation shaft is provided with a knob that rotates the turn operation shaft to control the predetermined setting condition.

9. The electronic apparatus according to claim 1, further comprising a packing member bridging over the receiving member and the fastening member, and held and pressed by the receiving member and the fastening member, and an arbitrary member opposed to the receiving member and the fastening member.

10. The electronic apparatus according to claim 9, wherein the packing member is provided with a protrusion facing and projecting toward the arbitrary member.

11. The electronic apparatus according to claim 10, wherein the protrusion is formed in a position opposed to the second flat surface.

12. A fixing structure for fixing, to a receiving member having an opening, an insertion member inserted through the opening and provided with a male thread on a peripheral surface thereof, the fixing structure comprising:
a fastening member that is provided with a female thread on an inner surface thereof threadably engaged with the male thread, fixes the insertion member to the receiving member by engaging the female thread with the male thread, and covers the opening; and
a first O-ring positioned between the insertion member and the fastening member and a second O-ring positioned between the fastening member and the receiving member, in a state in which the insertion member is fastened by the fastening member,
wherein, when viewing each circular cross-section of the first and second O-rings along a surface parallel to a moving direction of the fastening member when fastening the insertion member by rotating the fastening member, a first point of each circular cross-section is pressed against a surface perpendicular to the moving direction, and
a position displaced from a second point opposite to the first point of each circular cross-section is pressed against an inclined surface inclined to the moving direction.

* * * * *